(12) United States Patent
Nettem et al.

(10) Patent No.: US 12,726,159 B2
(45) Date of Patent: Sep. 1, 2026

(54) METHOD, DEVICE AND APPARATUS FOR BIASING A POWER AMPLIFIER OPERATIVE OVER WIDE SUPPLY RANGE

(71) Applicant: AXIRO SEMICONDUCTOR INC., San Diego, CA (US)

(72) Inventors: Veerendra Prasad Nettem, Bengaluru (IN); Valentino Toschi, Milan (IT); Pratik Kalyanasundaram, Bengaluru (IN); Volker Kempe, Dusseldorf (DE)

(73) Assignee: AXIRO SEMICONDUCTOR INC., San Diego, CA (US)

( * ) Notice: Subject to any disclaimer, the term of this patent is extended or adjusted under 35 U.S.C. 154(b) by 452 days.

(21) Appl. No.: 18/241,850

(22) Filed: Sep. 2, 2023

(65) Prior Publication Data

US 2025/0080064 A1 Mar. 6, 2025

(51) Int. Cl.
*H03F 1/02* (2006.01)
*H03F 3/21* (2006.01)

(52) U.S. Cl.
CPC ......... *H03F 3/21* (2013.01); *H03F 2200/375* (2013.01)

(58) Field of Classification Search
CPC .... H03F 3/21; H03F 2200/375; H03F 1/0272; H03F 2200/451; H03F 1/0261; H03F 1/301; H03F 1/302; H03F 3/19; H03F 3/245; H03F 1/30; H03F 2200/18; H03F 2200/462
USPC .......................................................... 330/296
See application file for complete search history.

(56) References Cited

U.S. PATENT DOCUMENTS 4,547,746 A * 10/1985 Erickson .............. H03G 3/3042 330/207 P

* cited by examiner

*Primary Examiner* — Jessica Han
*Assistant Examiner* — Khiem D Nguyen
(74) *Attorney, Agent, or Firm* — Knobbe, Martens, Olson & Bear, LLP

(57) ABSTRACT

According to an aspect, a bias controller for biasing a power amplifier in an electronic system comprising, a current sensor operative to sense a current flowing through the power amplifier, the current sensor exhibiting an offset error characteristic that is non linear over a first range of power supply voltages and a first set of offsets matching with the offset error characteristic over a second range of power supply voltages that are within the first range of power supply voltages, in that, the first set of offsets are applied for correcting the offset errors of the current sensor when the power amplifier is subjected to the second range of power supply voltages.

11 Claims, 4 Drawing Sheets

400
429
420
419
410
411A
411B
430

METHOD, DEVICE AND APPARATUS FOR BIASING A POWER AMPLIFIER OPERATIVE OVER WIDE SUPPLY RANGE

FIELD OF INVENTION

Embodiments of the present disclosure relate generally to electronic circuits and more specifically to a method, device and apparatus for biasing a power amplifier operative over wide supply range.

RELATED ART

Power amplifier is a device or an electronic circuit block that amplifies the input current, voltage or power (often referred to as input) to provides an amplified output in current, voltage and/or power. As is well known, the power amplifiers are employed in several electronic circuit applications such as transceivers in the wireless communication systems, electronic control systems, radar systems, etc. Due to its versatile usage and application, the power amplifiers are subjected different operating conditions and supply voltages. The power amplifiers, when deployed for operations are required to be biased (term Bias taking the general meaning from the relevant art) accurately to perform desired operation. Often, the biasing the power amplifier is a challenge and require complex electronic circuitry to perform the biasing. Accordingly, the Bias controller or biasing circuitry are made readily available in the form of an integrated circuit or as a device to interface and couple with the power amplifiers on any system/device/apparatus built for particular application and usage. In certain context Power amplifier may also refer to metal oxide semiconductor (MOS) transistor operative as amplifier or switch.

The Biasing circuit (hereafter "Bias Controller" without loss of generality) provides a biasing solution to the power amplifier. As is well known, the Bias controller consist circuitry and devices with interface terminals that may be coupled to the power amplifier for biasing. One of the functional requirements of the Bias controller is to monitor and maintain the bias parameters like voltage across amplifier terminals and current flow through the amplifier such as Drain current, Drain to Source voltage as in MOS transistor, for example. Accordingly, the Bias controller is generally configured to monitor/sense one or more Bias parameters and adjust or change certain other parameters like gate voltage, gate current to restore the desired Bias condition.

In similar manner, as the power amplifier is subjected to different operating voltages and conditions, the Bias controller is also subjected to the correspondingly different voltage and operating conditions. Thus, the Bias Controller is required to be calibrated so that any inherent error like offsets is compensated when the Bias controller is deployed for operation with power amplifier.

SUMMARY

According to an aspect, a bias controller for biasing a power amplifier in an electronic system comprising, a current sensor operative to sense a current flowing through the power amplifier, the current sensor exhibiting an offset error characteristic that is non linear over a first range of power supply voltages and a first set of offsets matching with the offset error characteristic over a second range of power supply voltages that are within the first range of power supply voltages, in that, the first set of offsets are applied for correcting the offset errors of the current sensor when the power amplifier is subjected to the second range of power supply voltages.

According to another aspect, a method of preparing a bias controller to bias a power amplifier operative over a wide range of supply voltage, the method comprising, receiving a first supply voltage range that is within and smaller than the wide range, measuring a first set of offsets corresponding to first set of voltages in the first supply voltage range and storing the first set of offsets to a memory in the bias controller.

According to another aspect a system comprising, a power amplifier powered by a power supply providing first voltage, a resistor coupled between the power supply and the power amplifier to sense a drain current of the power amplifier, and a bias controller coupled to the power amplifier is configured maintain the drain current at a constant value by adjusting bias at a Gate terminal of the power amplifier, wherein the bias controller comprises a first set of offsets matching with a offset error characteristic of the bias controller over a first range of power supply voltages that is only in and around the first voltage.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
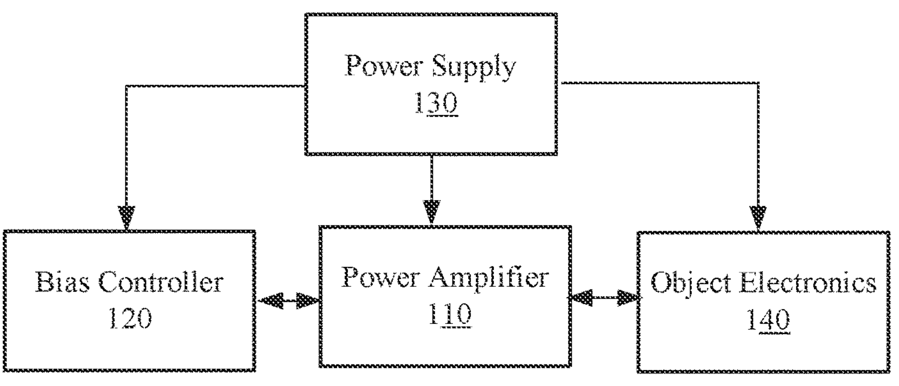
FIG. 1 is a block diagram illustrating an example scenario in which various aspect of the present invention may be seen.

FIG. 1 is a block diagram illustrating an example scenario in which various aspect of the present invention may be seen. The block diagram is shown comprising power amplifier 110, bias controller 120, power supply 130, and object electronics 140. Each block is further described below.

The object electronics 140 comprise devices and/or function blocks such as processors, arithmetic and logic unit, logical units, signal processors, filters, signal converters, special purpose processors, memory units etc., and circuitry interconnecting these devices to perform a desired operation like modulation, signal processing, logical operation, data processing, transmission of signals/information in accordance with one or more well know protocols and standards such as communication protocol 5G, for example. The object electronics may be an ensemble of individual devices on a printed circuit board or an ensemble of devices on an integrated circuit like system on chip (SOC) and/or group of IP cores integrated to form a single function device fabricated together with block 110-130.

The power supply 130 provides required power to the object electronics 140, power amplifier 110, and bias controller 120. In one embodiment, the power supply may comprise multiple power supplies capable of energising the device as per the requirements. For example, the power supply 130 may provide the power at different voltage levels like 3 volts, 5 Volts, 12 Volts, 24 Volts, 48 Volts etc., For example. The logical unit blocks, processor block may be energised at 3 Volts or 5 volts while the amplifiers enhancing the power may be energised at 24 or 48 Volts. In certain other embodiment, the power supply 130 may comprise independent and plurality of power supplies built or integrated with the respective devices.

Power amplifier 110 amplifies at least one of voltage, current and power of a signal received at its input and provides the amplified signal at the output. The signal may be a continuous time varying signal, a discrete signal and/or a switching signal. For example, the power amplifier 110 may convert a low power on/off signal to high power on/off signal or it's complimentary. Accordingly, the power amplifier may be biased such that, a low power on/off signal (for example binary/digital signal) may operate the power amplifier as a switch. In certain embodiment, the power amplifier may be biased (operate in an active mode) to replicate the low power signal to corresponding high power signal.

The Bias controller 120 provides required terminal voltages/current (Hereafter Bias Point) to the power amplifier 110 such that, a low power signal is capable of operating the power amplifier in the desired manner. In other words, when the bias controller 120 is interfaced to power amplifier 110 and connected to power supply 130, the power amplifier 110 is biased for performing the desired operation by another signal of lower power signal (often the low power signal ride on the biased voltage or current). In one embodiment, the power amplifier 110 is subjected to or configured to operate at the different supply voltages levels and operating conditions. Thus, the Bias controller 120 is configured to detect the operating condition and/or supply voltage to adjust the bias point.

Figure 2:
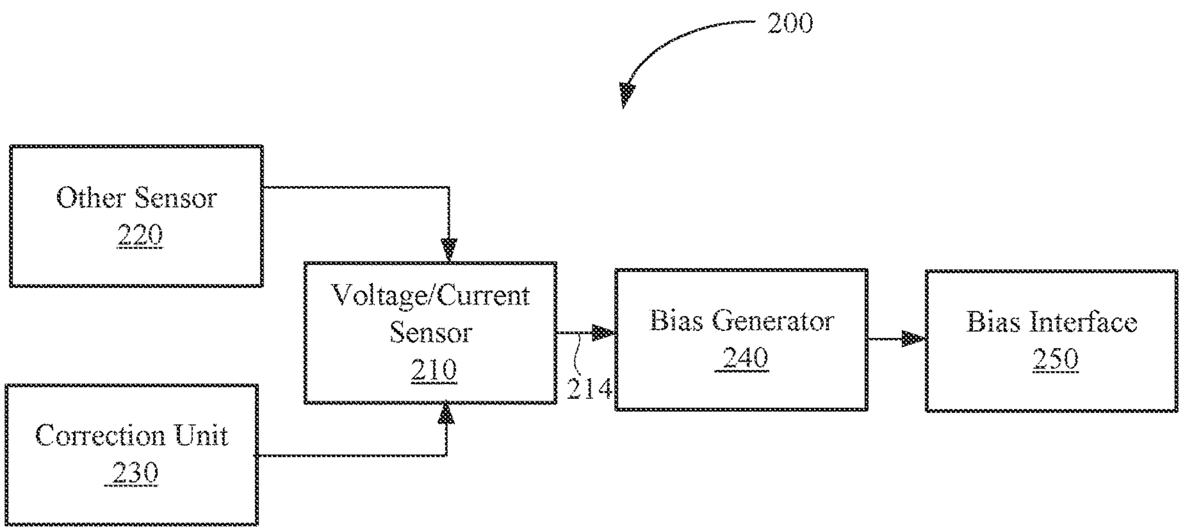
FIG. 2 is an example Bias controller in an embodiment.

FIG. 2 is an example Bias controller in an embodiment. The Bias controller 200 is shown comprising current/voltage sensor 210, other sensors 220, correction unit 230, Bias generator 240, and Bias interface 250. Each element is further described below.

The current/voltage sensor (CS) 210 senses/measures the current flowing into/through the power amplifier 110 (or voltage across/between terminals of power amplifier 110) and generates a corresponding signal representing the measured current/voltage. In one embodiment, the CS senses the current flowing into the drain/source terminal (drain current, also corresponds to load current) of the power amplifier. The CS 210 generates a CS output signal (may be in terms of a voltage or current) representing the measured current. In one embodiment the, the CS may receive a correction factor form the correction unit 230 and generate the CS output signal that is corrected/adjusted in accordance with the correction factor. The CS output signal is provided to the Bias generator 240 on path 214. The other sensors 220 may comprise temperature sensor operative to sense temperature/other operating conditions. The sensed operating conditions are provided as other sensor signal to the Bias generator 240.

The Bias interface 250 is/are the terminal(s) on which the bias voltage or current (Bias) is provided for coupling to the power amplifier 110. When Bias interface 250 is coupled to power amplifier, in operation, the power amplifier gets the required Biasing for operation. The Bias generator 240 provides a biasing voltage or current to the power amplifier 110. The Bias voltage or current may be initially set to a primary value in accordance with a known targeted operation. The primary value may be set by adopting a circuitry that derives the Primary value from the power supply at the bias interface. In operation, the Bias generator may adjust the primary value based on the sensor output signal. For example, bias generator may add or subtract the CS output signal to/from primary value to generate the bias voltage at the bias interface 250.

The correction unit 230 provides a correction factor to the current sensor 210. The correction unit 230 may provide the correction factor that is pre-stored in a memory for various operating conditions like supply voltage. Alternatively, the correction unit 230 may generate a correction factor by interpolating the stored reference values. In one embodiment, the correction unit may be integrated with the current sensor and may operate in conjunction to generate more precise CS output signal. Bias controller 200 may be fabricated/implemented as an integrated circuit.

Figures 3, 4A:
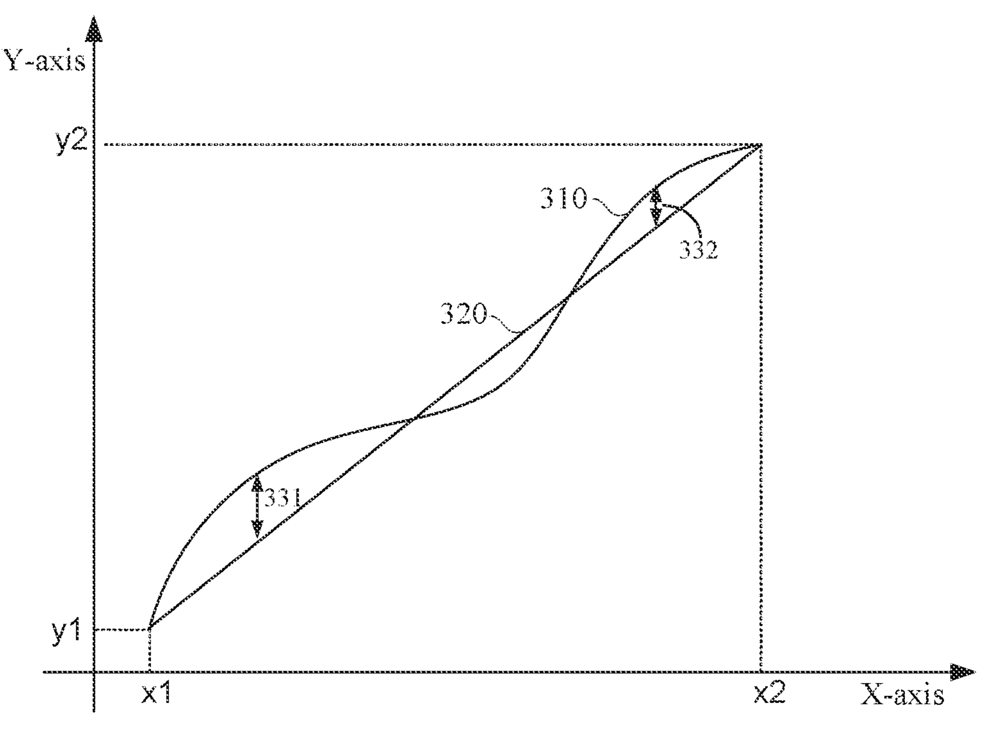
FIG. 3 is an example offset characteristic (graph) illustrating the verifying offset with respect to an example range of supply voltage.
FIG. 4A is an example embodiment illustrating the combined implementation of the current sensor and the correction unit configured to reduce the offset error over larger range of power supply.

As is well known in the art, conventional current sensor output may not faithfully represent the measured current or voltage due to several inaccuracies in the fabrication and operating condition. The deviation from the accurate representation of measure current is referred to as error or offset. Further, the offset may not be constant over a range of power supply or operating conditions of power amplifier. FIG. 3 is an example offset characteristic (graph) illustrating the verifying offset with respect to an example range of supply voltage. As shown there, X-axis representing the supply voltage and Y-axis representing the offset voltage, the curve 310 representing current sensor offset, that is non linear. Thus, a fixed or a constant or a no correction factor (also known as calibration value) may introduce an undesirable error into the current sensor output signal. In certain conventional Bias controller, two known offset voltage values y1 and y2 at the corresponding two operating voltages x1 and x2 are stored in a memory. The curve 320 representing the linear approximation to the curve 310. When deployed, correction factor corresponding to an applied power supply voltage is generated by interpolating from the linear relation 320. As may be seen, such conventional technique introduces undesirable error into the current sensor output signal when the operating conditions (like supply voltages) are not at y1 and y2 and may exceed a tolerance (limit) (as at 331 and 332) set for certain applications.

FIG. 4A is an example embodiment illustrating the combined implementation of the current sensor and the correction unit configured to reduce the offset error over a range of power supply. In that, the offset remain more accurate over a range or plurality of desired ranges of power supply. The embodiment 400 is shown comprising differential amplifier 410, Offset correction unit 420, and memory 430. Each element is further described below.

The differential amplifier 410 receives differential signal on terminals 411A and 411B that is measured across a sensing element (not shown). The sensing element may be external to the Bias controller. The differential amplifier (in this case, operative as current sensor) amplifies the differential signal, say, a voltage measured across the sensing element like resistor. The amplified value of the differential signal (Raw sensor output) is provided as the output at the terminal 419.

The offset correction unit 420 receives the raw sensor output from differential amplifier 410 and fetches offset correction from the memory 430 to generate a corrected sensor output on path 429. In one embodiment, the offset correction unit determine the power supply voltage $V_{t1}$ at a given point in time t1 and fetches the offset from memory corresponding to the $V_{t1}$. The offset correction unit 420 may subtract or add the offset value, as may be the case, to the raw sensor output to generate the final current sensor output.

Figure 4B:
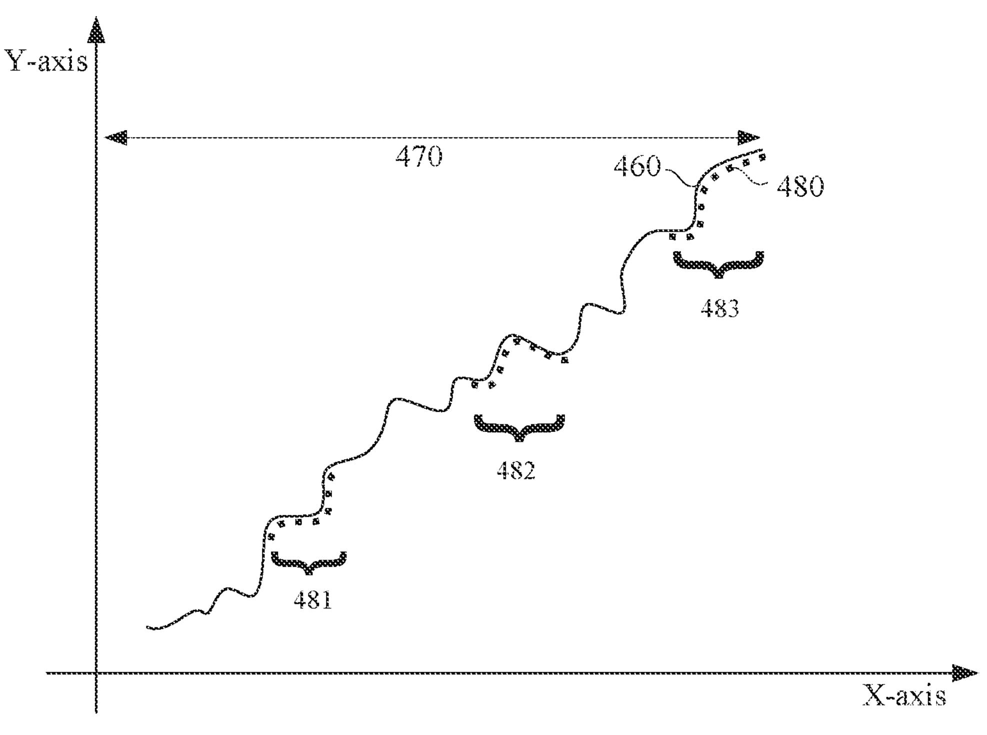
FIG. 4B is a graph illustrating the offset values stored in the memory 430.

The memory 430 stores offset values for selected ranges of power supply. FIG. 4B is a graph illustrating the offset values stored in the memory 430. As shown there the curve 460 is the non-linear offset characteristic of the differential amplifier (current sensor) over power supply range 470. The curve 480 represents the offset values stored in the memory. It may be appreciated that, offset values in the range 481, 482 and 483 matches with the offset curve. Thus, when the Bias controller and power amplifier is subjected to the power supply in the range of 481, 482, and 483, the offset is accurately corrected. It may be further appreciated that, even when the power supply voltage varies due to temperature, loading, regulator error etc, the offset remain accurately calibrated or compensated since the memory is configured to store the offset value over smaller ranges 481, 482, and 483 within the large range 470. Further ranges 481, 482, 483 etc., may be shifted or moved to the desired voltages based on the requirement. In one embodiment, the offset value for the supply voltages that are outside the range 481, 482 and 483 may be determined by linear approximation technique using any two values (more appropriate) in the curve 480. The ability to dynamically change/shift the ranges 481, 482 and 483 after the fabrication of the device 400 is further described below.

The Bias controller may be fabricated to cater to wide range of supply voltage. However, each batch or subset of the manufactured Bias controllers may be used for specific application where the supply voltage may be known apriori (predetermined) and may vary marginally from the predetermined value. Thus, The Bias Controller may be prepared for biasing the power amplifier with enhanced accuracy by calibrating and loading the offset values in the desired voltage ranges only.

Figure 5:
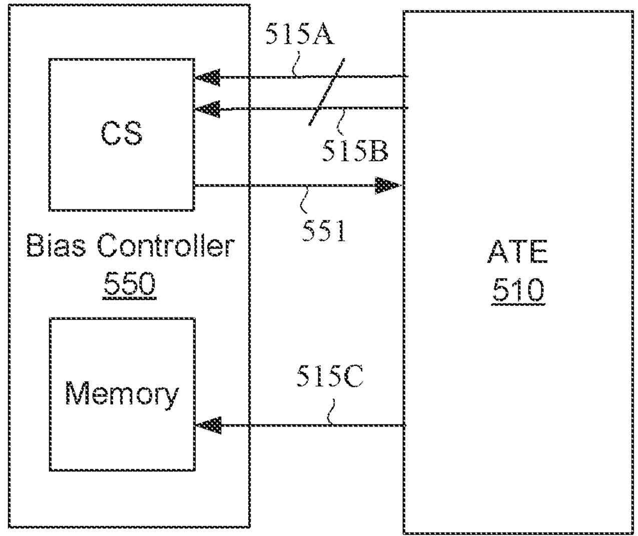
FIG. 5 is an example system illustrating the manner in which the offset values for selected multiple supply voltages (ranges) may be stored in the memory 430 in an embodiment.

FIG. 5 is an example system illustrating the manner in which the offset values for selected multiple supply voltages (ranges) may be stored in the memory 430 in an embodiment. The system for storing the offsets is shown comprising Automatic Test Equipment (ATE) 510 and Bias controller 550. In that, the ATE 510 and Bias controller 550 are interfaced for calibration mode of operation. The ATE 510 is configured to provide selected supply voltages for calibration. For example, if the Bias controller 550 is targeted for operation at 24V (volts), then, the ATE 510 may calibrate the Bias controller for the supply voltages from 20V to 28V in steps of 1V or 0.5V. The Offsets is measured on path 551 by forcing differential input voltage (of the current sensor CS) to Zero. That may be achieved by holding both the differential inputs terminals 515A and 515B at same potential (common mode voltage) for every selected supply voltage. The measured offsets are stored in the memory of the Bias controller 550 indexed to corresponding supply voltages. In other words, the each measured offset may be encoded or digitally coded and written to the memory (stored) on path 515C. Likewise, instead measuring the offsets for one range of voltages (20-28V), the offsets may be measured for plurality of ranges. The Measured offsets are coded and stored in the memory and are referred as points. Thus, a given memory is efficiently used for targeted operation as against using the memory for entire range of supply voltage. Alternatively, memory size or requirement is reduced by storing offsets related to targeted voltage ranges, thus making the Bias controller efficient in terms of cost and size.

Figure 6:
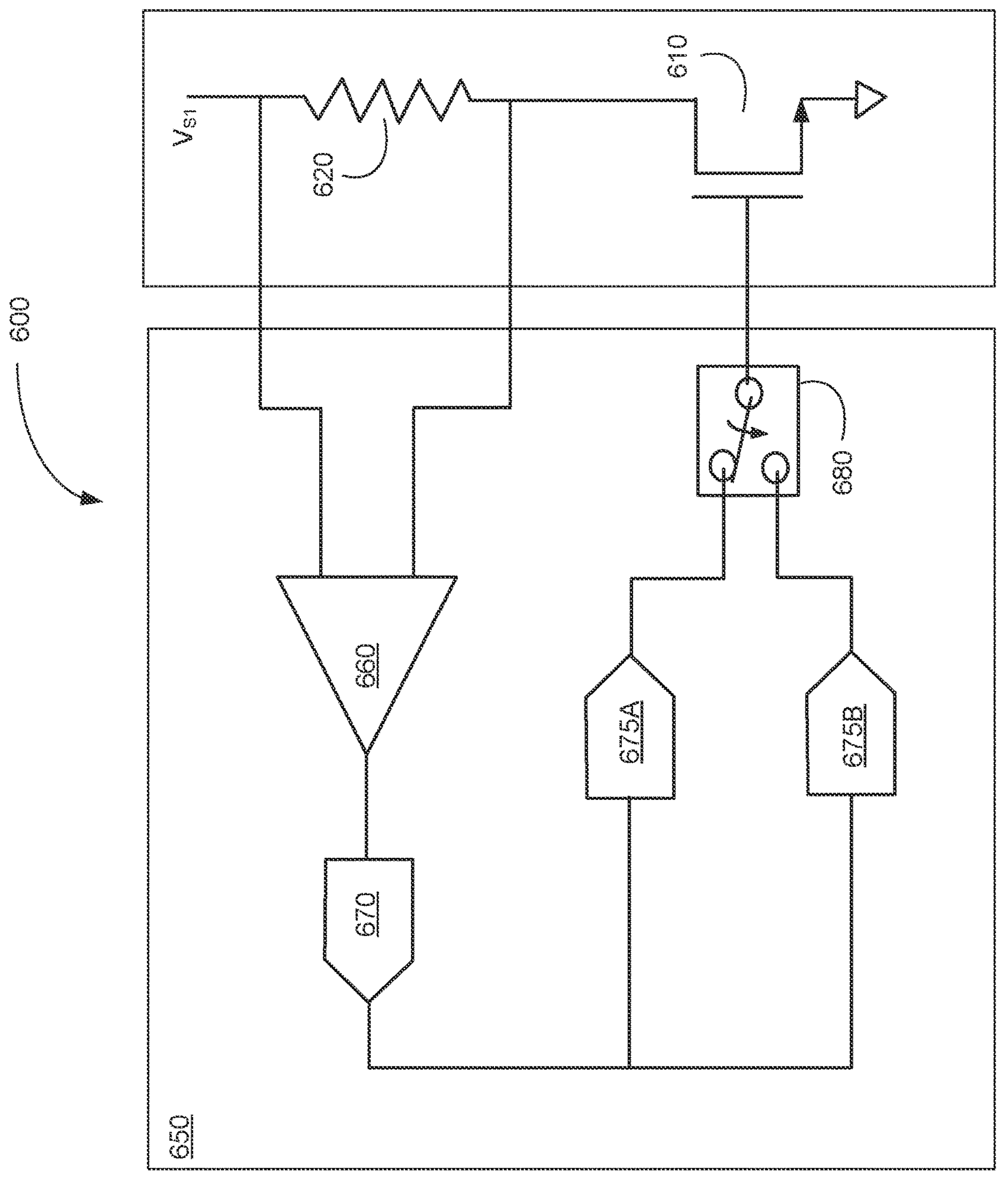
FIG. 6 is an example system in which the Bias controller is operative in the target application.

FIG. 6 is an example system in which the Bias controller is operative in the target application. The system 600 is shown comprising, Bias controller 650, power amplifier 610, and resistor 620. The Bias controller 650 is further shown comprising current sensor 660, ADC 670, DAC 675A and 675B, and switch 680. Each element is further described below.

Power amplifier 610 is configured to operate at supply voltage $V_{S1}$ (in one embodiment $V_{S1}$ is equal to 24V). In the system 600, the $V_{s1}$ may vary/drift between $V_{sa}$ and $V_{sb}$ due to several operating condition and power regulation error. In one embodiment the $V_{sa}$ is equal to 20V and $V_{sb}$ is equal to 28V).

The resistor 620 operates as current sensor and generates a voltage proportional to the current flowing through it (referred as drain current). The resistance value of the resistor 620 maintained at low value (typically in the range of 0.1 Ohms) to support the high power dissipation requirement of the power amplifier. The Bias controller 650 is therefore is operative to sense the drain current (or small voltage developed across the resistor 620) and provide an appropriate gate bias to ensure the drain current is constant even when there is a variation in the supply voltage $V_{S1}$.

The bias controller 650 is configured to bias any power amplifier operating in the supply voltage range $V_a$ to $V_b$ that is much larger than the $V_{sa}$ and $V_{sb}$ (in one embodiment $V_a$ is equal to 2V and to $V_b$ is equal to 54V). Accordingly, all semiconductor devices and circuitry of the bias controller 650 is structured to support such requirement. The Bias controller 650 memory is loaded with offset values for the range $V_{sa}$ through $V_{sb}$ in steps of δV and optionally offsets for $V_a$ to $V_b$. Thus, the Bias controller is loaded with the offsets for $V_{sa}$, $V_{sa}$+δV, $V_{sa}$+2δV, $V_{sb}$. In one embodiment δV is equal to 1V and the offsets are 20V, 21V, 22V, 23V, 24V, 25V, 26V, 27V and 28V). Thus by storing only 9 points, high precision corrections are provided. The offsets values for 20V-28V may be written to memory (for example, 430 described above) of the Bias controller 650 in the last phase of calibration before shipping.

Accordingly, in the bias controller 650, the current sensor 660 is operative similar to current sensor 400 described above. In that, the current sensor 660 measures the voltage across the resistor 620 representing the drain current. Offset corrected current sensor output is provided to ADC (analog to digital convertor) 670. ADC 670 generates digital value corresponding measured current/voltage. A digital controller (not shown) is operative to couple the ADC 670 output to one of the DACs 675A and 675B based on the type of the power amplifier (NMOS/PMOS). Further, the digital controller may also operate the switch 680 to receive the bias signal from one of the DACs 675A and 675B that converts the digital value received from ADC 670 to corresponding analog bias current/voltage.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A bias controller for biasing a power amplifier in an electronic system comprising:

a current sensor operative to sense a current flowing through the power amplifier, the current sensor exhibiting an offset error characteristic that is non-linear over a first range of power supply voltages; and a first set of offsets matching with the offset error characteristic over a second range of power supply voltages that are within the first range of power supply voltages, in that, the first set of offsets are applied for correcting the offset errors of the current sensor when the power amplifier is subjected to the second range of power supply voltages.

2. The bias controller of claim 1, wherein the first set of offsets are digital values stored in a memory.

3. The bias controller of claim 1, wherein the first set of offsets corresponds to a first set of voltages that are equally distributed over the second range of power supply voltages.

4. The bias controller of claim 3, further comprising second set of offsets matching with the offset error characteristic over a third range of power supply voltages that are within the first range of power supply voltages and outside the second range of power supply voltages.

5. The bias controller of claim 4, wherein the second set of offsets are applied for correcting the offset errors of the current sensor when the power amplifier is subjected to the third range of power supply voltages.

6. A method of preparing a bias controller to bias a power amplifier operative over a wide range of supply voltage, the method comprising:

receiving a first supply voltage range that is within and smaller than the wide range;

measuring a first set of offsets corresponding to a first set of voltages in the first supply voltage range; and storing the first set of offsets to a memory in the bias controller.

7. The method of claim 6, wherein the first set of voltages are equally distributed over the first supply voltage range.

8. The method of claim 7, wherein said measuring further comprising:

coupling the bias controller to the power amplifier;

forcing differential inputs of the bias controller to its common mode voltage equal to a supply voltage of the power amplifier;

measuring the first set of offsets by setting the supply voltage to the first set of voltages in steps.

9. A system comprising:

a power amplifier powered by a power supply providing a first voltage;

a resistor coupled between the power supply and the power amplifier to sense a drain current of the power amplifier; and a bias controller coupled to the power amplifier; is configured to maintain the drain current at a constant value by adjusting a bias at a gate terminal of the power amplifier, wherein the bias controller comprises a first set of offsets matching with an offset error characteristic of the bias controller over a first range of power supply voltages that includes the first voltage, wherein the first range is within a second range of power supply voltages associated with the power amplifier.

10. The system of claim 9, wherein the bias controller further comprises a current sensor exhibiting said offset error characteristic over a wide range of supply voltages and said first range forms only a part of the wide range.

11. The system of claim 10, wherein the part is less than one fourth of the wide range.

* * * * *